(12) United States Patent
Kawaguchi et al.

(10) Patent No.: US 6,956,323 B2
(45) Date of Patent: Oct. 18, 2005

(54) COLOR CONVERSION FILTER SUBSTRATE AND ORGANIC MULTICOLOR LIGHT EMITTING DEVICE

(75) Inventors: Koji Kawaguchi, Kanagawa (JP); Yotaro Shiraishi, Kawasaki (JP); Yukinori Kawamura, Kanagawa (JP)

(73) Assignee: Fuji Electric Co., Ltd., Kawasaki (JP)

( * ) Notice: Subject to any disclaimer, the term of this patent is extended or adjusted under 35 U.S.C. 154(b) by 238 days.

(21) Appl. No.: 10/368,358

(22) Filed: Feb. 20, 2003

(65) Prior Publication Data

US 2004/0164669 A1 Aug. 26, 2004

(51) Int. Cl.$^7$ ................................................ H01J 1/62
(52) U.S. Cl. ....................... 313/501; 313/504; 313/506; 313/112; 359/359
(58) Field of Search ............................... 313/112, 501, 313/504, 506; 359/359

(56) References Cited

U.S. PATENT DOCUMENTS 5,909,081 A * 6/1999 Eida et al. .................. 313/504

FOREIGN PATENT DOCUMENTS

| JP | 3-261091 | 11/1991 |
| JP | 5-41281 | 2/1993 |
| JP | 7-049483 | 2/1995 |
| JP | 7-169567 | 7/1995 |
| JP | 8-279394 | 10/1996 |
| JP | 9-35868 | 2/1997 |
| JP | 11-144864 | 5/1999 |

OTHER PUBLICATIONS

JIS, K7125, Plastics–Film and Sheeting–Determination of the coefficients of friction, Revised Aug. 20, 1999.
JIS, Z0208, Testing methods for determination of the water vapour transmission rate fo moisture–proof packaging materials 9Dish Method), Revised on Mar. 1, 1976.

* cited by examiner

*Primary Examiner*—Vip Patel
(74) *Attorney, Agent, or Firm*—Manabu Kanesaka

(57) ABSTRACT

A color conversion filter substrate includes a transparent support substrate, at least one color conversion filter layer formed of a resin film containing a fluorescence colorant with a thickness of at least 5 μm and arranged on the support substrate in a desired pattern, and a transparent gas-barrier layer formed in a flat film for covering the color conversion layer. The gas-barrier layer has a water-vapor permeability of 1.0 g/m$^2$·24 hr or less, and a portion covering the color conversion filter layer with a thickness $t_{PL}$ expressed by the following equation, $$0 < t_{PL} < 0.1 \ W$$

wherein W is a minimum width of a pixel.

5 Claims, 2 Drawing Sheets

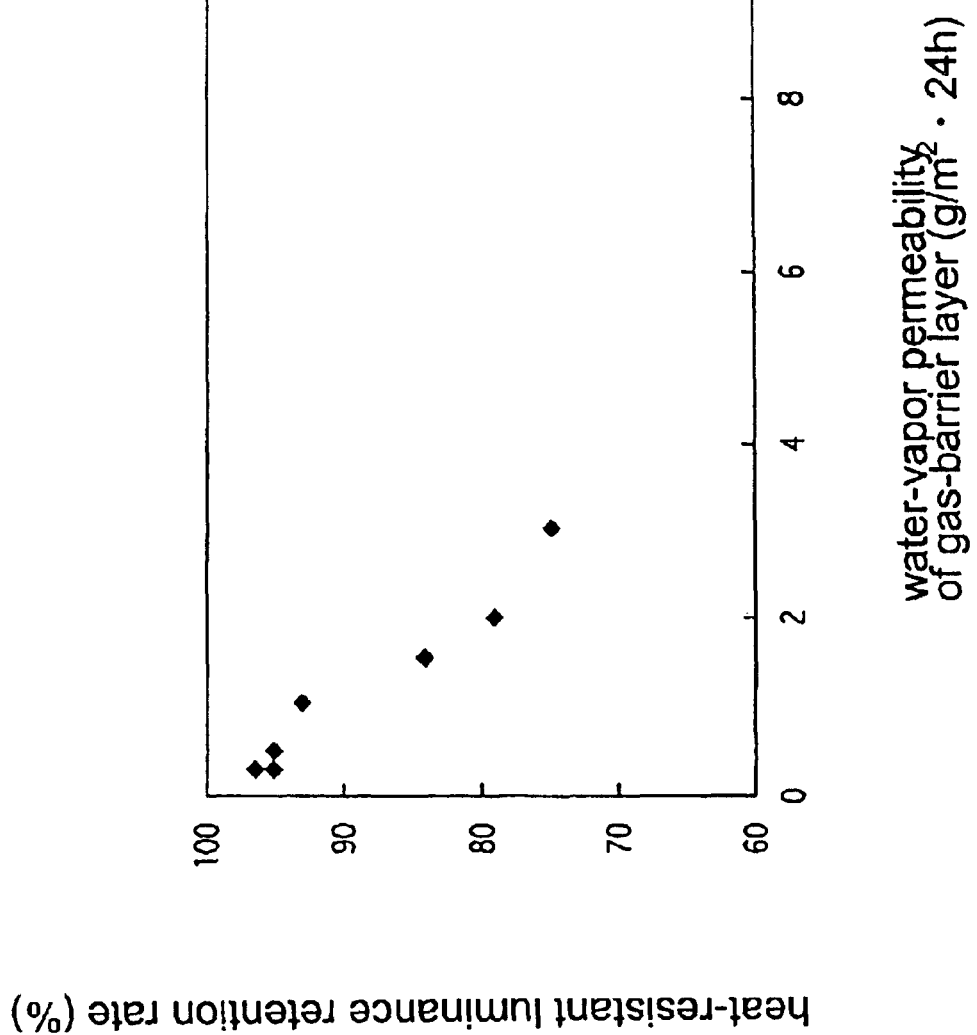

COLOR CONVERSION FILTER SUBSTRATE AND ORGANIC MULTICOLOR LIGHT EMITTING DEVICE

BACKGROUND OF THE INVENTION AND RELATED ART STATEMENT

The present invention relates to a color conversion filter substrate with good environmental resistance and high productivity for displaying multiple colors with high definition, and to an organic multicolor emitting display device provided with such a filter substrate. More specifically, the present invention relates to a color conversion filter substrate and an organic multicolor emitting display device provided with such a filter substrate for a display of electronic and electric equipment such as an image sensor, a personal computer, a word processor, a television, a fax machine, an audio equipment, a video equipment, a car navigation system, an electric desk top calculator, a telephone, a portable terminal, or an industrial instrument.

In recent years, the information technology has been diversified. Among elements used in the information technology, display devices including solid imaging devices have been required to have a better aesthetic appearance, a lighter weight, a thinner thickness and higher performance. Furthermore, a great deal of effort has been made to reduce power consumption and increase a response speed. In particular, many attempts have been made to develop high-definition full-color display devices.

In the second half of the 1980s, Tang et al. reported that an organic electro-luminescence (hereinafter referred as an "organic EL") formed of stacked thin films of organic molecules showed a high luminance of 1000 cd/m$^2$ at an applied voltage of 10 V (Appl. Phys. Lett., 51, 913 (1987)). This stacked organic EL device has excellent characteristics such as a wide view angle and a quick response time compared to liquid crystal display devices. After the report by Tang et al., a great effort has been made to develop organic EL devices for a practical use. Attempts have also been made to develop similar devices composed of an organic polymer material.

Since the organic EL device provides a high current density at a low voltage, it is expected to provide higher emission luminance and efficiency as opposed to inorganic EL devices and LEDs.

The organic EL display device is expected to have characteristics such as (1) high luminance and high contrast, (2) low driving voltage and high emission efficiency, (3) high resolution, (4) wide angle visibility, (5) high response speed, (6) possibility of increasing definition and providing color displays, (7) reduced weight and reduced thickness, and the like. Thus, the organic EL device is expected to have a better aesthetic appearance, a lighter weight, a thinner thickness and higher performance.

Tohoku Pioneer Corporation has already developed products including vehicle-mounted green monochrome organic EL displays since November 1997. In order to meet the society needs, it is desirable to develop improved organic EL displays that are stable for an extended period of time, respond quickly, and display multiple colors or full colors with high definition.

A method of displaying multiple or full colors with the organic EL display includes methods disclosed in Japanese Patent Publications No. 57-167487, No. 58-147989, and No. 03-214593, in which light emitting elements of the three primary colors (red, green, and blue) are arranged in a matrix form. In a case that the organic light emitting device is used to provide a multicolor display, it is necessary to arrange three types of light-emitting materials (R, G, and B) in a matrix form with high precision, thereby making it technically difficult to produce and increasing a cost. Further, the three types of light-emitting materials have different life times, thereby shifting a color of the display with time.

In Japanese Patent Publications No. 01-315988, No. 02-273496, and No. 03-194895, a method in which a color filter and a backlight emitting white light are used to display the three primary colors through the filter has been disclosed. However, it is difficult to obtain an organic light emitting device emitting the white light with a long life, which is necessary for obtaining bright three colors R, G, and B.

Japanese Patent Publication No. 03-152897 disclosed another method in which phosphors arranged on a plane absorb light from light emitting devices, so that the phosphors emit fluorescence in multiple colors. Such a method using a certain luminous device to allow the phosphors to emit fluorescence in multiple colors has been applied to CRTs, plasma displays, and the like.

Further, in recent years, a color conversion method has been proposed in which a filter is composed of a fluorescent material for absorbing light with a wavelength in a light-emission region of an organic light emitting device, so that the fluorescent material emits fluorescence with a wavelength in a visible light region (Japanese Patent Publications No. 03-152897 and No. 05-258860). In this approach, an organic light emitting device that emits a color other than white can be used. Therefore, it is possible to use an organic light emitting device with higher brightness as a light source. In a color conversion method using an organic light emitting device emitting blue light (Japanese Patent Publications No. 03-152897, No. 08-286033, and No. 09-208944), a frequency of blue light is converted to that of green or red light. A color conversion filter containing a fluorescent material with such color conversion effect may be formed in a high resolution pattern. Accordingly, it is possible to provide a full-color light emitting display even with weak energy light such as near-ultraviolet light or visible light.

In order to form a pattern of a color conversion filter, a method in which a pattern is formed with a photolithography process after a film of a resist (photosensitive polymer) material containing fluorescent material is prepared by spin-coating is disclosed in Japanese Patent Publications No. 05-198921 and No. 05-258860. Also, Japanese Patent Publication No. 09-208944 discloses a process in which a fluorescent material or fluorescent pigment is dispersed in a basic binder followed by etching the binder with an acid solution.

In general, it is important for a practical color display to possess high-resolution color and long-term stability (as described in KinohZairyo Vol. 18, No. 2, 96). However, the organic EL devices tend to markedly lose light-emission characteristics such as current-luminance characteristics after a specific period of time.

A major cause of the degraded light-emission characteristics is a growth of dark spots in the light-emitting layer. The dark spots are formed of light-emission defects. When the fluorescent material in the light-emitting layer is oxidized while using or storing the organic EL device, the dark spots grow and spread over the entire light-emitting surface.

It is believed that the dark spots are created by oxidation or aggregation of a material constituting a layered device caused by oxygen or moisture in the device. The dark spots grow not only when electricity is conducted but also during storage. In particular, it is believed that (i) the growth is accelerated by oxygen or moisture present around the device, (ii) the growth is affected by oxygen or moisture attached to the organic stacked films, and (iii) the growth is affected by moisture attached to parts or entered in the device when the device is manufactured.

Thus, methods have been proposed to suppress the growth of the dark spots. For example, a method in which a device is installed and sealed in an airtight container along with diphosphorous pentaoxide as a desiccant for drying the layered material of the device is disclosed in Japanese Patent Publication No. 03-261091. Also, Japanese Patent Publication No. 07-169567 discloses a structure in which diphosphorous pentaoxide is blended into a protective layer and a sealing layer for drying. In these methods, however, diphosphorous pentaoxide for drying is changed into phosphoric acid due to the moisture, thereby affecting the organic layered material. Other proposed methods include an airtight container filled with an inactive liquid containing a desiccant (Japanese Patent Publications No. 05-4128 and No. 09-35868), and use of a pressure-sensitive adhesive (U.S. Pat. No. 5,304,419).

As described above, in order to provide an organic multicolor light emitting device with stable light-emission characteristics for an extended period of time, the growth of the dark spots needs to be sufficiently suppressed.

FIG. 1 shows an example of the layered structure of the color conversion filter substrate. In the figure, reference numerals 1, 2, 3, 4, 5, and 6 refer to a transparent support substrate, a red conversion filter, a green conversion filter, a blue conversion filter, a first gas-barrier layer, and a second gas-barrier layer, respectively. As shown in FIG. 2, an organic multicolor light emitting device includes such a color conversion substrate. The organic multicolor light emitting device is constructed by sequentially stacking a transparent electrode 7, a hole-injection layer 8, a hole-transporting layer 9, an organic light-emitting layer 10, an electron-injection layer 11, and an electrode 12 on the color conversion filter substrate.

As shown in FIG. 2, in the color conversion organic multicolor light emitting device (organic EL display), the color conversion filters 2, 3, and 4 are disposed under the transparent electrode 7. As described above, the color conversion filter is formed of the resin containing the colorant for color conversion. Because of thermal stability of the colorant, it is not possible to dry the color conversion filter at a temperature above 200° C. Accordingly, it is likely that the color conversion filters 2, 3, and 4 contain moisture from a coating liquid or entered during a pattern-forming process. The moisture in the color conversion filters 2, 3, and 4 passes through the barrier layers 5 and 6 to the light-emitting layer 10 while the device is stored or is continuously operated, thereby facilitating the growth of the dark spots in the light-emitting layer 10.

The sealing method described above is to prevent moisture and oxygen in the air from entering the light emitting device. Thus, with this method, it is difficult to eliminate the moisture from the color conversion filters, thereby making it difficult to successfully develop a color organic EL display with the stable light-emission characteristics for an extended period of time.

The present invention is provided in view of the above problems. An object of the present invention is to provide a color conversion filter substrate with stable light-emission characteristics for an extended period of time, in which moisture is suppressed to prevent degradation of the organic multicolor light emitting device.

Further objects and advantages of the invention will be apparent from the following description of the invention.

SUMMARY OF THE INVENTION

According to the present invention, a color conversion filter substrate comprises a transparent support substrate, at least one color conversion filter layer formed of a resin film containing a fluorescence colorant with a thickness of at least 5 $\mu$m and arranged on the support substrate in a desired pattern, and a transparent gas-barrier layer formed in a flat film for covering the color conversion layer. The gas-barrier layer has a water-vapor permeability less than 1.0 g/m²·24 hr, and a portion covering the color conversion filter layer with a thickness $t_{PL}$ expressed by the following equation, $$0 < t_{PL} < 0.1\ W$$

wherein W is a minimum width of a pixel.

Further, according to the present invention, an organic multicolor light-emitting display device comprises a color conversion filter substrate, and a layered luminous device including at least a transparent electrode layer formed at one or more electrically isolated areas on a gas-barrier layer of the color conversion filter substrate and an organic light-emitting layer formed on the transparent electrode layer. The color conversion filter substrate comprises a transparent support substrate, at least one color conversion filter layer formed of a resin film containing a fluorescence colorant with a thickness of at least 5 $\mu$m and arranged on the support substrate in a desired pattern, and the transparent gas-barrier layer formed in a flat film for covering the color conversion layer. When an electric signal is sent to the transparent electrode of a pixel at a desired location, the light-emitting layer at the pixel emits light. The light enters the color conversion filter layers at the pixel through the gas-barrier layer. Then, the light optically excites the fluorescence colorant in the light-conversion filter layer to cause fluorescent-light emission, so that the organic multicolor light-emitting display device displays a predetermined emission color through the support substrate. The gas-barrier layer has a water-vapor permeability less than 1.0 g/m²·24 hr, and a portion covering the color conversion filter layer with a thickness $t_{PL}$ expressed by the following equation, $$0 < t_{PL} < 0.1\ W$$

wherein W is a minimum width of a pixel.

BRIEF DESCRIPTION OF THE DRAWINGS

FIG. 3 is a graph showing a relationship between a heat-resistant luminance retention rate and a water-vapor permeability of organic multicolor light emitting devices.

DETAILED DESCRIPTION OF PREFERRED EMBODIMENTS

Hereunder, embodiments of the present invention will be explained with reference to the accompanying drawings.

Figure 1:
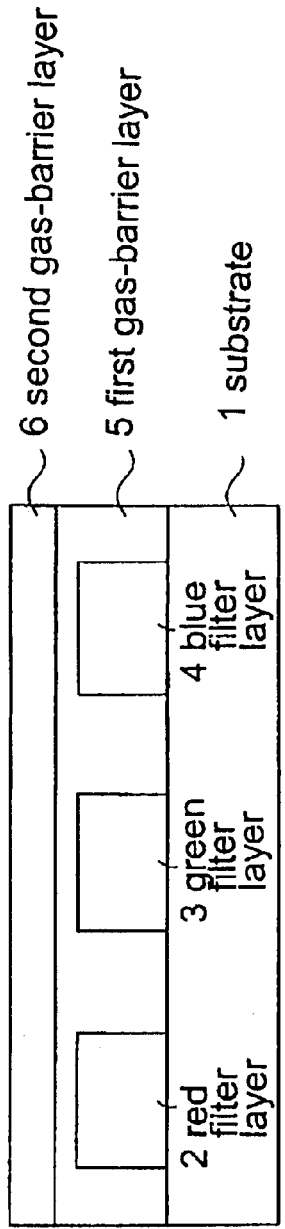
FIG. 1 is a schematic diagram showing a sectional view of a color conversion filter substrate.
Figure 2:
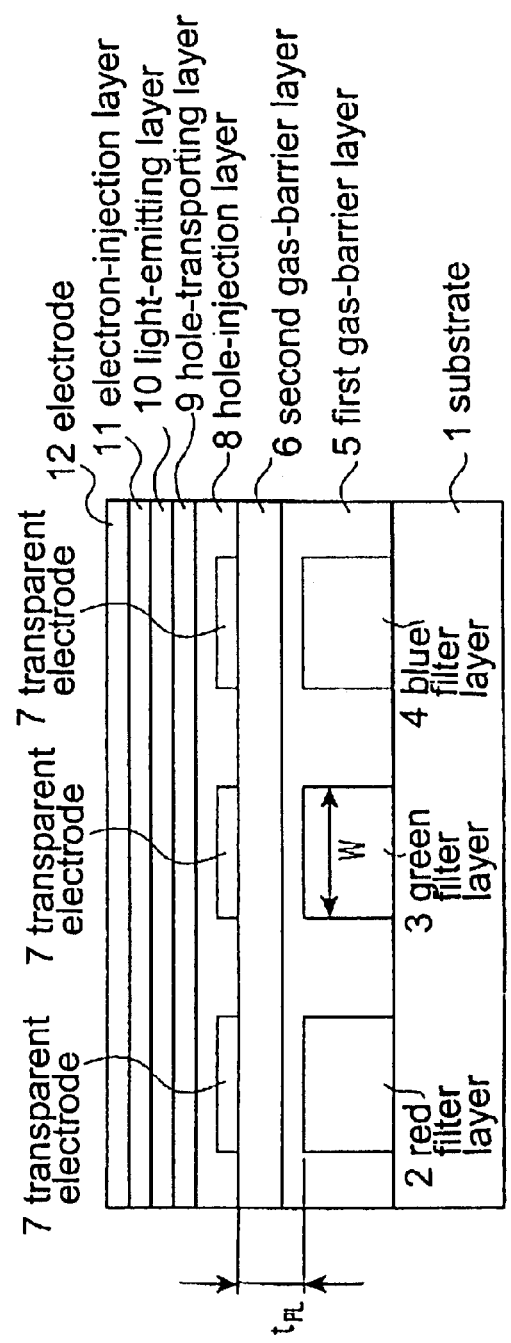
FIG. 2 is a schematic diagram showing a sectional view of an organic multicolor light emitting device.

As previously described, FIG. 1 is a sectional view showing a color-converting filter composed of color-converting filter layers 2, 3, and 4 made of red, green, and blue dyes or pigments, respectively, and formed on the transparent support plate 1, and the gas-barrier layers 5 and 6 formed over the color-converting filter layers 2, 3, and 4. Further, FIG. 2 shows an example of a sectional structure of a color-converting organic multicolor EL display in which a transparent electrode 7 and an organic EL light-emitting layer 10 are stacked on the color-converting filter substrate.

The inventors conducted thorough studies in order to solve the previously described problems, and thus, the inventors have found that moisture contained in the color-converting filter layers 2, 3, and 4 is prevented from reaching the light-emitting layer 10 to generate dark spots when the water-vapor permeability of the barrier layers 5 and 6 is set to 1.0 g/m²·24 h or less, and the film thickness $t_{PL}$ of that portion of the gas-barrier layer that lies on the color-converting filter layers is set to a range indicated by:

$$0 < t_{PL} < 0.1 \, W \quad (1)$$

wherein W denotes the minimum width of a pixel.

In the present invention, an organic fluorescence colorant constituting a color conversion filter layer absorbs light with a wavelength in a near-ultraviolet or visible region emitted by a luminous device, especially light with a wavelength in a blue or bluish green region, to emit another visible light. It is preferred that one or more types of fluorescence colorants emitting at least fluorescence with a wavelength in the red region are used, and may be combined with one or more types of fluorescence colorants emitting fluorescence with a wavelength in a green region. That is, it is easier to obtain an organic light emitting device that emits light with a wavelength in the blue or bluish-green region. When the light is converted to light with a wavelength in the red region through a simple red filter, an intensity of the light is greatly reduced due to a small amount of red light in the original light.

It is possible to obtain high intensity light with a wavelength in the red region by using a fluorescence colorant to convert light from the organic light emitting device into light with a wavelength in the red region. Similar to the red light, it is possible to obtain light with a wavelength in the green region by using another organic fluorescence colorant to convert light from the organic light emitting device into light with a wavelength in the green region. Alternatively, the light from the light emitting device may pass through a green filter to obtain green light when the light from the organic light emitting device contains a sufficient amount of light with a wavelength in the green region. Also, the light from the organic light emitting device passes through a blue filter to obtain light with a wavelength in the blue region.

The fluorescence colorants that absorbs light with a wavelength in the blue or bluish-green region emitted from the luminous device to emit fluorescence with a wavelength in the red region includes, for example, rhodamine-based colorants such as rhodamine B, rhodamine 6G, rhodamine 3B, rhodamine 101, rhodamine 110, sulforhodamine, basic violet 11, and basic red 3, cyanine-based colorants, pyridine-based colorants such as 1-ethyl-2-[4-(p-dimethylaminophenyl)-13-butadienyl]-pyridium-perchlorate (pyridine 1), and oxazine-based colorants. Furthermore, various dyes (direct dyes, acid dyes, basic dyes, disperse dyes, etc.) can be used provided that they are fluorescent.

The fluorescence colorants that absorbs light with a wavelength in the blue or bluish-green region emitted from the luminous device to emit fluorescence with a wavelength in the green region includes, for example, coumarin-based colorants such as 3-(2'-benzothiazolyl)-7-diethylaminocoumarin (coumarin 6), 3-(2'-(benzimidazolyl)-7-N,N-diethylaminocoumarin(coumarin 7), 3-(2'-N-methylbenzimidazolyl)-7-N,N-diethylaminocoumarin(coumarin 30), and 2,3,5,6-1H,4H-tetrahydro-8-trifluoromethylquinolizino (9,9a,1-gh) coumarin (coumarin 153), basic yellow 51 as a coumarin colorant-based dye, and naphthalimide-based colorants such as solvent yellow 11 and solvent yellow 116. Furthermore, various dyes (direct dyes, acid dyes, basic dyes, disperse dyes, etc.) can be used provided that they are fluorescent.

The organic fluorescence colorants may be formed in an organic fluorescent pigment by blending the pigments in advance into a resin such as polymethacrylate, polyvinyl chloride, vinyl chloride-vinyl acetate copolymer, alkyd resin, aromatic sulfonamide resin, urea resin, melamine resin, benzoguanamine resin, and a mixture of these resins. Further, these types of organic fluorescence colorants or organic fluorescent dyes (in the specification, these are collectively referred as organic fluorescence colorants) may be used solely, or two or more types of such colorants may be combined together in order to adjust color of the fluorescence. According to the present invention, the device contains 0.01 to 5 wt %, more preferably 0.1 to 2 wt %, of such an organic fluorescence colorant with reference to a weight of a fluorescence color conversion film. When the device contains less than 0.01 wt % of the organic fluorescence colorant, wavelength conversion will not be sufficient. When the device contains more than 5 wt % of the organic fluorescence colorant, the color-conversion efficiency may be decreased due to a concentration quenching effect or the like.

A matrix resin used for the fluorescence color conversion filter layers is a photo-setting or photo- and thermosetting resin. The matrix resin is cured optically and/or thermally to generate radicals or ion seeds to polymerize and cross-link, thereby obtaining a material that is not soluble and does not melt. It is preferred that the photo-setting resin or photo- and thermo-setting resin is soluble in an organic solvent or an alkali solution before curing so that the fluorescence color conversion film is formed in a pattern.

The photo-setting resin or photo- and thermo-setting resin includes (1) a composition containing an acrylic multifunctional monomer/oligomer having acroyl groups or methacroyl groups and a photo- or thermo-polymerization initiator, wherein the composition is optically or thermally treated to generate optical or thermal radicals for polymerization, (2) a composition containing polyvinyl ester cinnamate and a sensitizer, wherein the composition is thermally treated to produce diners for cross-linking, (3) a composition containing a linear or cyclic olefin and bisazido, wherein the composition is optically or thermally treated to generate nitrene to cross-link with the olefin, or (4) a composition containing monomers having an epoxy group and a photo oxidizer, wherein the composition is optically or thermally treated to generate acids (cations) for polymerization. In particular, the photo-setting resin or photo- and thermo-setting resin of (1) provides high resolution and easy pattern formation, as well as good solvent- and heat-resistance and the like.

A material for the gas-barrier layer has high transparency in the visible region (permeability of 50% or greater at a wavelength of 400 nm to 700 nm), a Tg of 100° C. or higher, and a surface hardness of 2H or greater in terms of pencil hardness. The material is formed in a smooth coating film on the color conversion filter, and does not affect the functionality of the color conversion filter layers. Such a material includes a photo-setting resin and/or a thermo-setting resin such as an imide modified silicone resin (Japanese Patent Publications No. 05-134112, No. 07-218717, and No. 07-306311), an inorganic metal compound (TiO, $Al_2O_3$, $SiO_3$, or the like) dispersed in an acrylic, polyimide, silicone, or other resin (Japanese Patent Publications No. 05-119306 and No. 07-104114), an epoxy-modified acrylatol resin used as an ultraviolet curable resin (Japanese Patent Publication No. 07-48424), a resin having reactive vinyl groups of acrylate monomer/oligomer/polymer, or a resist resin (Japanese Patent Publications No. 06-300910, No. 07-128519, No. 08-279394, and No. 09-330793), an inorganic compound formed by a sol-gel process (monthly Display, Vol. 3, No. 7, 1997, Japanese Patent Publications No. 08-27394), or a fluorine-based resin (Japanese Patent Publications No. 05-36475 and No. 09-330793).

The gas-barrier layer can be formed with various methods. For example, the layer may be formed with a conventional method such as a dry process (sputtering, vapor deposition, CVD, or the like) or a wet process (spin coating, roll coating, casting, or the like).

As described above, the gas-barrier layer may be formed of a material that has an electrical insulating property and acts as a barrier with respect to gas and organic solvents. The material has high transparency in the visible region (a permeability of 50% or greater at a wavelength of 400 nm to 700 nm), and a film hardness of 2H or greater, which is sufficient to withstand when a positive electrode film is formed on the protective layer. The material may include, for example, an inorganic oxide such as SiOx, SiNx, SiNxOy, AlOx, TiOx, TaOx, or ZnOx, or an inorganic nitride. The gas-barrier layer is formed with various methods including a conventional process such as sputtering, CVD, vapor deposition, or dipping.

The gas-barrier layer may be formed in only one layer or multiple layers stacked together.

When the gas-barrier layer is applied to a color conversion organic light-emitting display, certain factors need to be considered. That is, it is necessary to consider an effect of a film thickness of the gas-barrier layer on display performance, particularly view-angle characteristic. The view-angle characteristic, important to the color conversion organic light-emitting display, relates to a change in color due to a change in a view angle.

When the gas-barrier layer has a large thickness, the excited light generated in the organic light-emitting layer needs to travel a longer distance to reach the color conversion layer above the organic light-emitting layer through the gas-barrier layer. As a result, when a user sees the display screen obliquely, the excited light leaks to an adjacent pixel, thereby producing a different color (optical cross talk). In order to obtain high display performance, it is necessary to minimize a ratio between the light in the adjacent color due to the optical cross talk and the light in the original color.

This requirement relates to a relationship between the thickness of the gas-barrier layer and a minimum width of the pixel.

An organic multicolor light emitting device according to the present invention comprises a fluorescence color conversion filter substrate and an organic luminous device. That is, the organic luminous device emits light with a wavelength in the near-ultraviolet or visible region, preferably light with a wavelength in the blue or bluish-green region. The light enters the fluorescence color conversion filter. The light is then output from the fluorescence color conversion filter layer as visible light with a different wavelength.

The organic luminous device is structured so as to sandwich organic luminous layers between a pair of electrodes. As needed, a hole-injection layer or an electron-injection layer is interposed between the luminous layers. The luminous device is composed of layers specified below;

(1) Positive electrode/organic light-emitting layer/ negative electrode,
(2) Positive electrode/hole-injection layer/organic light-emitting layer/negative electrode,
(3) Positive electrode/organic light-emitting layer/ electron-injection layer/negative electrode,
(4) Positive electrode/hole-injection layer/organic light-emitting layer/electron-injection layer/negative electrode,
(5) Positive electrode/hole-injection layer/hole-transporting layer/organic light-emitting layer/ electron-injection layer/negative electrode.

In the layer configurations described above, it is preferred that at least one of the positive and negative electrodes is transparent in the wavelength region of light emitted by the organic luminous device. The light passes through the transparent electrodes and enters the fluorescence color conversion film. It is known that the positive electrode can be made transparent easily. Thus, in the present invention, the positive electrode is desirably transparent.

A material for each of the layers is well known. For example, in a case that the organic light-emitting layer emits light with a wavelength in the blue or bluish-green region, a material includes benzothiazole-, benzimidazole-, benzoxazole-based fluorescent whitening agent, a metal chelated oxonium compound, a styrylbenzene-based compound, and an aromatic dimethylidine compound.

FIG. 2 shows a single pixel of the organic multicolor light emitting device having multiple pixels for displaying in multicolor or full-color. The organic luminous layer is formed of a positive electrode 7 formed on the gas-barrier layer 6 in a pattern and having a transparent electrode such as an ITO; a hole-injection layer 8 for covering the positive electrode 7; a hole-transporting layer 9 formed on the hole-injection layer 8; an organic light-emitting layer 10 formed on the hole-transporting layer 9; an electron-injection layer 11 formed on the organic light-emitting layer 10; and a negative electrode 12 formed on the electron-injection layer 11 and consisting of a metal electrode.

The positive and negative electrodes 7 and 12 may be formed in a parallel stripe pattern, or a cross pattern that the positive electrode 7 crosses the negative electrode 12. In a case of the cross pattern, the organic light emitting device of the present invention can be driven in matrix. That is, when a voltage is applied to a particular stripe of the positive electrode 7 and a particular stripe of the negative electrode 12, light is emitted from the point at which these stripes intersect. Accordingly, light can be emitted from a pixel of the organic light emitting device in which a particular fluorescence color conversion film and/or filter layer is located, when a voltage is applied to selected stripes of the positive and negative electrodes 7 and 12.

Alternatively, the positive electrode 7 may be formed in a uniform plane without a stripe pattern, and the negative electrode 12 may be formed in a pattern corresponding to the pixels. In such a case, switching elements corresponding to the respective pixels may be provided for active matrix driving.

With reference to FIGS. 1 and 2, examples of the layered gas-barrier layer for the organic light emitting device according to the present invention will be described.

EXAMPLE 1

(Production of Blue Conversion Filter Layer) A blue filter material (manufactured by Fuji Hunt Electronics Technology Co., Ltd.; Color Mosaic CB-7001) was formed in a film with the spin-coating process. The film was then patterned with the photolithography to obtain a line pattern of a blue conversion filter 4 having a line width of 0.1 mm, a pitch of 0.33 mm, and a film thickness of 6 $\mu$m.

(Production of Green Conversion Filter Layer) Coumarin 6 (0.7 parts by weight) as the fluorescent colorant was dissolved into 120 parts by weight of propylene glycol monomethyl ethel acetate (PGMEA) as a solvent. Then, 100 parts by weight of the photo-polymerizing resin "V259PA/P5" (trade name; manufactured by Nippon Steel Chemical Co., Ltd.) was added and dissolved in the mixture to obtain a coating liquid. The coating liquid was applied to a Corning glass (50 mm×50 mm×1.1 mm) as the transparent substrate 1 with the spin-coating process. The resulting film was then patterned with the photolithography to obtain a line pattern of a green conversion filter 3 having a line width of 0.1 mm, a pitch of 0.33 mm, and a film thickness of 10 $\mu$m.

(Production of Red Conversion Filter Layer) Coumarin 6 (0.6 parts by weight), rhodamine 6 G (0.3 parts by weight), and basic violet 11 (0.3 parts by weight) as the fluorescent colorants were dissolved in 120 parts by weight of propylene glycol monoethyl acetate (PGMEA) as a solvent. Then, 100 parts by weight of the photo-polymerizing resin "V259PA/P5" (trade name; manufactured by Nippon Steel Chemical Co., Ltd.) was added and dissolved in the mixture to obtain a coating liquid. The coating liquid was applied to a Corning glass (50 mm×50 mm×1.1 mm) as the transparent substrate 1 with the spin-coating process. The substrate was then patterned with the photolithography to obtain a line pattern 2 of a red conversion filter having a line width of 0.1 mm, a pitch of 0.33 mm, and a film thickness of 10 $\mu$m.

(Production of Gas-Barrier Layer) A UV cure resin (epoxy modified acrylate) was applied to the substrate 1 and the color conversion layers 2, 3, and 4 with the spin-coating process, and the resulting layer was cured by irradiation of chemical light using a high-pressure mercury lamp so that the first gas barrier 5 with a thickness of 8 $\mu$m was formed. At this time, the patterns 2, 3, and 4 of the fluorescence conversion filters were not deformed, and a top surface of the barrier layer 5 remained flat.

As the second gas-barrier layer 6, an 800 nm SiNx film was deposited on the gas-barrier layer 5 with the sputtering process. At this time, when the adhesion between the first and second gas-barrier layers 5 and 6 was evaluated using the crosscut adhesion test described in JIS5400, the test result showed good adhesion (>8 points).

The gas-barrier layer (stacked films 5 and 6) produced with the steps described above had a total thickness of 8.8 $\mu$m.

Further, when the gas-barrier layer (stacked films 5 and 6) was evaluated for water-vapor permeability using the method described in JISZ0208, the water-vapor permeability was determined to be 0.4 to 0.6 g/m$^2 \cdot$24 hr.

(Production of Organic Multicolor Light emitting device) As shown in FIG. 2, six layers were sequentially stacked on the filter produced as described above. The six layers included the positive electrode 7, hole-injection layer 8, hole-transporting layer 9, organic light-emitting layer 10, electron-injection layer 11, and negative electrode 12.

First, a film was formed with the sputtering process using a transparent electrode material (ITO) to cover the entire top surface of the gas-barrier layer 6, which is the outermost layer of the color conversion filter substrate. After the resist agent "OFRP-800" (trade name; manufactured by Tokyo Ohka Kogyo Co. Ltd.) was applied to the ITO, the resulting layer was patterned with the photolithography to obtain positive electrodes 7 (formed in a stripe pattern with a width of 0.094 mm, a gap of 0.016 mm, and a thickness of 100 nm) located at the respective light-emitting sections (red 2, green 3, and blue 4).

The color conversion filter substrate with the positive electrodes 7 formed thereon was placed in a resistance-heating vapor-deposition apparatus. Then, the hole-injection layer 8, the hole-transporting layer 9, the organic light-emitting layer 10, and the electron-injection layer 11 were sequentially formed on the substrate in a vacuum. Chemical structures of the materials used for these layers are shown in Table 1 below. During the process of forming the films, an internal pressure of a vacuum chamber was reduced to 1×10$^{-4}$ Pa. As the hole-injection layer 8, copper phthalocyanine (CuPc) was stacked in a thickness of 100 nm. As the hole-transporting layer 9, 4,4'-bis[N-(1-naphthyl)-N-phenylamino] biphenyl ($\alpha$-NPD) was stacked in a thickness of 20 nm. As the light-emitting layer 10, 4,4'-bis(2,2-diphenylvinyl)biphenyl (DPVBi) was stacked in a thickness of 30 nm. Furthermore, as the electron-injection layer 11, aluminum chelate (Alq) was stacked in a thickness of 20 nm.

Then, the negative electrode 12 consisting of an Mg/Ag (weight ratio: 10 to 1) layer with 200 nm of a thickness was formed by using a mask of a stripe pattern with a width of 0.30 mm and a gap of 0.03 mm perpendicular to the stripes of the positive electrodes (ITO) 7 in the vacuum.

The organic multicolor light emitting device thus obtained was sealed in a glove box under a dry-nitrogen atmosphere (oxygen and moisture, both with a concentration of 10 ppm or less) using a sealing glass (not shown) and a UV cure adhesive.

TABLE 1

| Layer configuration | Material | Chemical Structure |
|---|---|---|
| Hole-injection layer | Copper phthalocyanine | 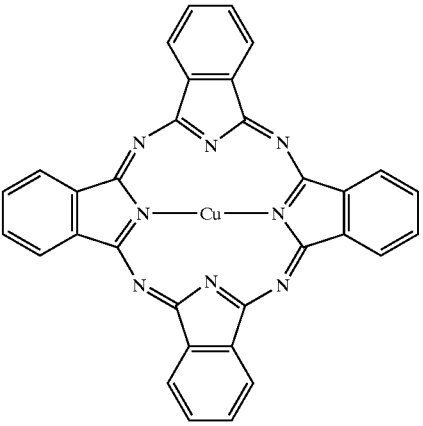 |
| Hole-transporting layer | 4,4'-bis[N-(1-naphthyl)-N-phenylamino] biphenyl | 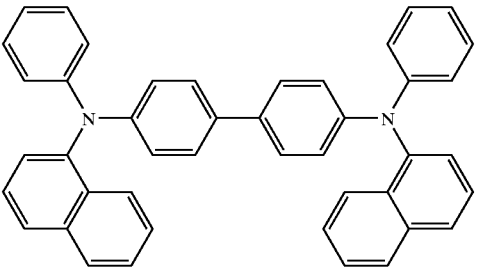 |
| Light-emitting layer | 4,4'-bis(2,2-diphenylvinyl) biphenyl | 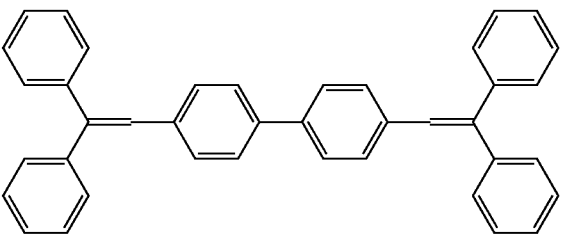 |
| Electron-transporting layer | Tris (8-hydroxyquinoline) aluminum complex | 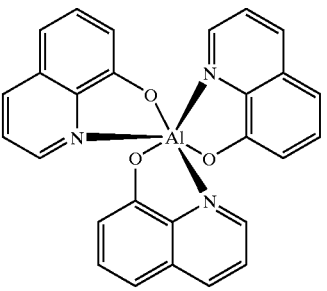 |

EXAMPLE 2

A light emitting device was produced in the same manner as in Example 1, except that the second gas-barrier layer 6 was 400 nm in thickness and the gas-barrier layer (stacked films 5 and 6) had a total thickness of 8.4 μm. The gas-barrier layer (stacked films 5 and 6) of the present example had a water-vapor permeability of 1.0 g/m²·24 hr.

COMPARATIVE EXAMPLE 1

A light emitting device was produced in the same manner as in Example 1, except that the second gas-barrier layer 6 was 150 nm in thickness and the gas-barrier layer (stacked films 5 and 6) had a total thickness of 8.2 μm. The gas-barrier layer (stacked films 5 and 6) of the present comparative example had a water-vapor permeability of 1.5 g/m²·24 hr.

COMPARATIVE EXAMPLE 2

A light emitting device was produced in the same manner as in Example 1, except that the first gas-barrier layer 5 was 6.0 μm in thickness, whereas the second gas-barrier layer 6 was 150 nm in thickness. The gas-barrier layer (stacked films 5 and 6) was adjusted to have a total thickness of 6.2 μm. The gas-barrier layer (stacked films 5 and 6) of the present comparative example had a water-vapor permeability of 2.0 g/m²·24 hr.

COMPARATIVE EXAMPLE 3

A light emitting device was produced in the same manner as in Example 1, except that the first gas-barrier layer 5 was 3.0 μm in thickness, whereas the second gas-barrier layer 6 was 150 nm in thickness. The gas-barrier layer (stacked films 5 and 6) was adjusted to have a total thickness of 3.2 μm. The gas-barrier layer (stacked films 5 and 6) of the present comparative example had a water-vapor permeability of 3.0 g/m²·24 hr.

COMPARATIVE EXAMPLE 4

A light emitting device was produced in the same manner as in Example 1, except that the first gas-barrier layer 5 was 3 μm in thickness, whereas the second gas-barrier layer 6 was 60 nm in thickness. The gas-barrier layer (stacked films 5 and 6) was adjusted to have a total thickness of 3.1 μm. The gas-barrier layer (stacked films 5 and 6) of the present comparative example had water-vapor permeability of 10 g/m²·24 hr.

COMPARATIVE EXAMPLE 5

A light emitting device was produced in the same manner as in Example 1, except that the first gas-barrier layer 5 was 13.0 μm in thickness. The gas-barrier layer (stacked films 5 and 6) was adjusted to have a total thickness of 13.8 μm. The gas-barrier layer (stacked films 5 and 6) of the present comparative example had a water-vapor permeability of 0.5 g/m²·24 hr.

COMPARATIVE EXAMPLE 6

A light emitting device was produced in the same manner as in Example 1, except that the first gas-barrier layer 5 was 30.0 μm in thickness, whereas the second gas-barrier layer 6 was 400 nm in thickness. The gas-barrier layer (stacked films 5 and 6) was adjusted to have a total thickness of 20.8 μm. The gas-barrier layer (stacked films 5 and 6) of the present comparative example had a water-vapor permeability of 0.2 to 0.5 g/m²·24 hr.

Evaluation

The light emitting devices produced according to the examples and comparative examples were evaluated for a heat-resistant luminance retention rate and a view angle property. The results of the evaluation are shown in Table 2.

The heat-resistant luminance retention rate is defined by;

Heat-resistant luminance retention rate $(\%) = (L_{500h}/L_o) \times 100$ where, Lo is an initial emission luminance when the light emitting device is driven with a predetermined current before aging, and $L_{500h}$ is an emission luminance measured when the light emitting device is driven with a predetermined current after aging at 85° C. for 500 hours.

Further, the view-angle characteristic was evaluated according to a criteria described below.

A panel of the organic multicolor light emitting device was fixed to a gonio stage, and turned on to be in a lighting state (white display). Then, an angle dependence of chromaticity (CIE-x, y) was measured by rotating the panel up to 80° in both the vertical and horizontal directions with respect to normal of the panel set at 0°. A spectrometer (MCPD-1000; manufactured by Otsuka Optical Co., Ltd.) was used for the measurement.

A device was determined to be 'pass' when a change Δ in chromaticity and x and y values, relative to values at the angle of 0° was less than 0.05 within the angle of 80° in the vertical and horizontal directions. Otherwise, they were considered 'failure'.

TABLE 2

Results of the Evaluation of Examples and Comparative Examples

| Sample | Water-vapor permeability (g/m² · 24 hr) | Gas-barrier-layer thickness (μm) | Heat-resistant luminance retention rate (%) | View-angle characteristic |
|---|---|---|---|---|
| Example-1 | 0.4~0.6 | 8.8 | 95 | Pass |
| Example-2 | 1.0 | 8.4 | 93 | Pass |
| Comparative Example-1 | 1.5 | 8.2 | 84 | Pass |
| Comparative Example-2 | 2.0 | 6.2 | 79 | Pass |
| Comparative Example-3 | 3.0 | 3.2 | 75 | Pass |
| Comparative Example-4 | 10.0 | 3.1 | 65 | Pass |
| Comparative Example-5 | 0.2~0.4 | 13.8 | 95 | Failure |
| Comparative Example-6 | 0.2~0.4 | 20.8 | 96 | Failure |

The evaluation showed that the heat-resistant luminance retention rate was 80% or greater when the gas-barrier layer (stacked films 5 and 6) had water-vapor permeability of 1.5 g/m²·24 hr or less. In particular, the heat-resistant luminance retention rate was 90% or greater when the gas-barrier layer had water-vapor permeability of 1.0 g/m²·24 hr or less.

Further, the view-angle characteristic was acceptable when the gas-barrier film had a thickness $t_{PL}$ of 8.8 μm or less. However, the view-angle characteristic was rejected when the gas-barrier film had a thickness $t_{PL}$ of 13.8 μm or greater. In the examples and comparative examples, the pixels had a minimum width W of 0.094 mm. Accordingly, there is a correlation between a thickness within $0 < t_{PL} < 0.1$ and the good view-angle characteristic.

When the gas-barrier film has the water-vapor permeability and thickness specified by the present invention, the color conversion filter substrate can suppress the generation of moisture, thereby improving the characteristics of the organic multicolor light emitting device. Therefore, it is possible to provide the organic multicolor light emitting device with the stable light-emission characteristics for an extended period of time. Therefore, according to the present invention, it is possible to provide the reliable color conversion organic EL display having the excellent view-angle characteristics.

While the invention has been explained with reference to the specific embodiments of the invention, the explanation is illustrative and the invention is limited only by the appended claims.

What is claimed is:

1. A color conversion filter substrate, comprising:

a transparent support substrate, at least one color conversion filter layer formed on the support substrate in a pattern and formed of a resin film containing a fluorescence colorant, and a gas-barrier layer formed of a transparent film for covering in a flat form the at least one color conversion layer and a surface of the transparent support substrate on which the color conversion layer is formed, said gas-barrier layer having a water-vapor permeability of equal to or less than 1.0 g/m²·24 hr and having a portion on the color conversion filter layer with a thickness $t_{PL}$ defined by:

$$0 < t_{PL} < 0.1\, W$$

wherein W is a minimum width of the at least one color conversion filter layer.

2. A color conversion filter substrate according to claim 1, wherein said gas-barrier layer has a laminate structure formed of at least first and second layers made of different materials.

3. A color conversion filter substrate according to claim 1, wherein said minimum width of the at least one color conversion filter layer is a minimum width of the pattern of the color conversion filter layer.

4. An organic multicolor light-emitting display device comprising: the color conversion filter substrate according to claim 1, a transparent electrode layer formed on the gas-barrier layer on the color conversion filter substrate at at least one electrically independent area, and an organic light-emitting layer formed on the transparent electrode layer so that when an electric signal is sent to the transparent electrode layer, the organic light-emitting layer emits light to the color conversion filter layer through the gas-barrier layer, thereby inducing fluorescent-light emission of the organic fluorescent colorant in the color conversion filter layer for allowing the organic multicolor light-emitting display device to display a predetermined color through the support substrate.

5. An organic multicolor light-emitting display device according to claim 4, wherein said gas-barrier layer has a laminate structure formed of at least first and second layers made of different materials.

* * * * *

UNITED STATES PATENT AND TRADEMARK OFFICE
CERTIFICATE OF CORRECTION

PATENT NO. : 6,956,323 B2
APPLICATION NO. : 10/368358
DATED : October 18, 2005
INVENTOR(S) : Koji Kawaguchi et al.

It is certified that error appears in the above-identified patent and that said Letters Patent is hereby corrected as shown below:

Please change column 6, line 33, "thermosetting" to -- thermo-setting --,

Column 6, line 49, "diners" to -- dimers --,

Column 6, line 62, "100°C." To -- 100°C --,

Column 9, line 33, "6 G" to -- 6G --,

Column 10, line 49, "diphenylvinyl)biphenyl" to -- diphenylvinyl) biphenyl --,

Column 13, line 43, "Evaluation" to -- EVALUATION --, and

Column 13, line 55, " 85°C. " to -- 85°C --.

Signed and Sealed this

Seventh Day of November, 2006

JON W. DUDAS
*Director of the United States Patent and Trademark Office*